(12) United States Patent
Inoue

(10) Patent No.: US 10,355,463 B2
(45) Date of Patent: Jul. 16, 2019

(54) SHIELD CONDUCTIVE PATH

(71) Applicant: Sumitomo Wiring Systems, Ltd., Yokkaichi, Mie (JP)

(72) Inventor: Hiroshi Inoue, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 15/866,969

(22) Filed: Jan. 10, 2018

(65) Prior Publication Data

US 2018/0198266 A1 Jul. 12, 2018

(30) Foreign Application Priority Data

Jan. 12, 2017 (JP) ................................. 2017-003285

(51) Int. Cl.

| | |
|---|---|
| *H01B 7/17* | (2006.01) |
| *H01R 4/18* | (2006.01) |
| *H01R 9/05* | (2006.01) |
| *H02G 3/04* | (2006.01) |
| *H02G 3/06* | (2006.01) |
| *H05K 9/00* | (2006.01) |
| *H02G 15/02* | (2006.01) |
| *H01R 13/115* | (2006.01) |
| *H01R 13/648* | (2006.01) |

(Continued)

(52) U.S. Cl.
CPC .............. *H02G 3/0481* (2013.01); *H01B 7/17* (2013.01); *H01R 4/185* (2013.01); *H01R 9/0524* (2013.01); *H01R 13/115* (2013.01); *H01R 13/648* (2013.01); *H01R 13/6593* (2013.01); *H05K 9/0007* (2013.01); *H05K 9/0098* (2013.01); *H01R 13/6473* (2013.01); *H02G 3/0616* (2013.01); *H02G 15/025* (2013.01)

(58) Field of Classification Search
CPC .... H01B 7/17; H01R 13/648; H01R 13/6593; H01R 4/185; H05K 9/0007; H05K 9/0098
See application file for complete search history.

(56) References Cited

U.S. PATENT DOCUMENTS

| 4,799,900 A | * | 1/1989 | Capp ....................... H01R 9/05 |
| | | | 439/468 |
| 5,707,253 A | * | 1/1998 | Matsumoto .......... H01R 9/0524 |
| | | | 439/607.5 |

(Continued)

FOREIGN PATENT DOCUMENTS

| JP | 2005-203217 | 7/2005 |
| JP | 2005203217 A | * 7/2005 |

*Primary Examiner* — Timothy J Thompson
*Assistant Examiner* — Rhadames Alonzo Miller
(74) *Attorney, Agent, or Firm* — Gerald E. Hespos; Michael J. Porco; Matthew T. Hespos

(57) ABSTRACT

A shield conductive path includes a shielded wire (10). An outer conductor shell (20) has a tubular shell body (21), a shell-side fixing portion (26) and a coupling (23) extending therebetween. The shell-side fixing portion (26) is fixed to a front part (13F) of a braided wire (13). An inner conductor terminal (40) has a terminal body (41) at a front part and a terminal-side fixing portion (42) in a rear part. The terminal body (41) is accommodated in the shell body (21). The terminal-side fixing portion (42) is fixed to a front part (11F) of a core (11) in the coupling (23), and a shield cover (50) surrounds an inner conductor connecting portion (45) composed of the front part (11F) of the core (11) and the terminal-side fixing portion (42) in a non-contact manner.

5 Claims, 11 Drawing Sheets

(51) Int. Cl.
   *H01R 13/6473* (2011.01)
   *H01R 13/6593* (2011.01)

(56) References Cited

U.S. PATENT DOCUMENTS

| | | | | |
|---|---|---|---|---|
| 6,217,381 | B1* | 4/2001 | Kameyama | H01R 9/0518 |
| | | | | 439/578 |
| 6,322,390 | B1* | 11/2001 | Takeuchi | H01R 24/542 |
| | | | | 439/289 |
| 6,837,743 | B2* | 1/2005 | Ko | H01R 9/0518 |
| | | | | 439/582 |
| 7,318,730 | B2* | 1/2008 | Miyazaki | H01R 4/024 |
| | | | | 439/83 |
| 7,762,841 | B2* | 7/2010 | Ho | H01R 9/0518 |
| | | | | 439/582 |
| 7,980,894 | B1* | 7/2011 | Hall | H01R 24/40 |
| | | | | 439/585 |
| 9,676,349 | B2* | 6/2017 | Kanagawa | H02G 3/0462 |
| 9,742,168 | B2* | 8/2017 | Kanagawa | B60R 16/0215 |
| 2013/0306346 | A1* | 11/2013 | Izawa | H02G 3/0468 |
| | | | | 174/102 R |
| 2016/0134093 | A1* | 5/2016 | Albert | H01R 9/0518 |
| | | | | 174/360 |
| 2018/0254122 | A1* | 9/2018 | Hagi | H01B 7/04 |

\* cited by examiner

SHIELD CONDUCTIVE PATH

BACKGROUND

Field of the Invention

The invention relates to a shield conductive path.

Description of the Related Art

Japanese Unexamined Patent Publication No. 2005-203217 discloses a shield conductive path in which an end of a signal line of a shielded cable is connected to a connecting portion of an inner conductor terminal accommodated in a dielectric housing and an end part of a braided wire of the shielded cable is connected to a shield shell surrounding the dielectric housing. In the shield conductive path of this type, transmission performance can be improved by keeping an impedance constant over the entire length of the shield conductive path. To keep the impedance constant over the entire length of the shield conductive path, an impedance needs to be matched over the entire length also in an end part of the shielded cable. It is thought as one prerequisite for matching the impedance of the end part of the shielded cable over the entire length to keep a radial interval between the outer periphery of an inner conductor conductive path composed of the signal line and the inner conductor terminal and the inner periphery of an outer conductor conductive path composed of the braided wire and the shield shell constant over the entire length.

The signal line and the braided wire are kept in a proper positional relationship in a region of the shielded cable where an insulating member is interposed between the outer periphery of the signal line and the inner periphery of the braided wire. Thus, impedance is matched over the entire length. Further, a positional relationship between a terminal body on a side of the inner conductor terminal closer to a tip than the connecting portion and the shield shell also is kept properly by the dielectric housing. Thus, the impedance is matched over the entire length in a region where the terminal body and the shield shell correspond.

In contrast, a positional relationship between the connecting portion of the inner conductor terminal and the shield shell is such that an impedance in a region where the connecting portion of the inner conductor terminal and the shield shell correspond does not match an impedance in a region where the signal line and the braided wire correspond and an impedance in the region where the terminal body and the shield shell correspond since an outer diameter of the conductor connecting portion is smaller than that of the terminal body. Thus, transmission performance may be reduced.

The invention was completed based on the above situation and aims to improve transmission performance in a connecting part of an inner conductor terminal and a core of a shielded wire.

SUMMARY

The invention is directed to a shield conductive path with a shielded wire formed such that a core is surrounded by a tubular shield layer. The shield conductive path further includes an outer conductor shell with a tubular shell body at a front part, a shell-side fixing portion at a rear part and a coupling. The shell-side fixing portion is fixed electrically conductively to a front end part of the shield layer. The shell body and the shell-side fixing portion are coupled electrically conductively by the coupling. An inner conductor terminal includes a terminal body in a front part and a terminal-side fixing portion in a rear part. The terminal body is accommodated in the shell body. The terminal-side fixing portion is fixed electrically conductively to a front part of the core in the coupling. A shield cover includes a cover-side fixing portion electrically conductively fixed to at least one of the outer conductor shell and the shield layer and a cover body is configured to surround an inner conductor connecting portion composed of the front end part of the core and the terminal-side fixing portion in a non-contact manner.

The terminal body is surrounded by the shell body of the outer conductor shell. However, the inner conductor connecting portion is surrounded by the cover body of the shield cover, which is a component separate from the outer conductor shell. According to this configuration, even if the terminal body and the inner conductor connecting portion differ in size in a cross-section intersecting an axial direction of the shield conductive path, an impedance in a region where the inner conductor connecting portion and the cover body correspond can be matched with an impedance in a region where the terminal body and the shell body correspond and an impedance in a region where the shield layer and the shell-side fixing portion correspond. This can improve transmission performance in a connecting part of the inner conductor terminal and the core of the shielded wire.

The cover body may include a flexible cover displaceable in a radial direction. According to this configuration, one type of the shield cover can be used as a common component for a plurality of types of the inner conductor terminals differing in the size of the inner conductor connecting portion.

A cover-side dielectric may be mounted on an inner periphery of the cover body to surround the inner conductor connecting portion. Thus, workability is good since the shield cover and the cover-side dielectric can be handled integrally when mounting the shield cover and the cover-side dielectric on the outer conductor shell and the shielded wire.

The cover body may include a flexible cover displaceable in a radial direction, and the cover-side dielectric may include a flexible covering portion configured to displace in the radial direction integrally with the flexible cover. According to this configuration, one type of the cover-side dielectric can be used as a common component for plural types of the inner conductor terminals differing in the size of the inner conductor connecting portion.

The cover body and the coupling may have displacement restricting portions configured to restrict a relative displacement of the cover body with respect to the coupling by being locked to each other. Thus, the shield cover is fixed stably to the outer conductor shell by the locking of the displacement restricting portions and the fixing of the cover-side fixing portion.

The coupling has two side walls disposed to sandwich the inner conductive connecting portion in a width direction intersecting an axis. According to this configuration, a fixing step of the terminal-side fixing portion and the core can be performed after or at the same time as the outer conductor shell is assembled with the shielded wire.

DETAILED DESCRIPTION

Figure 1:
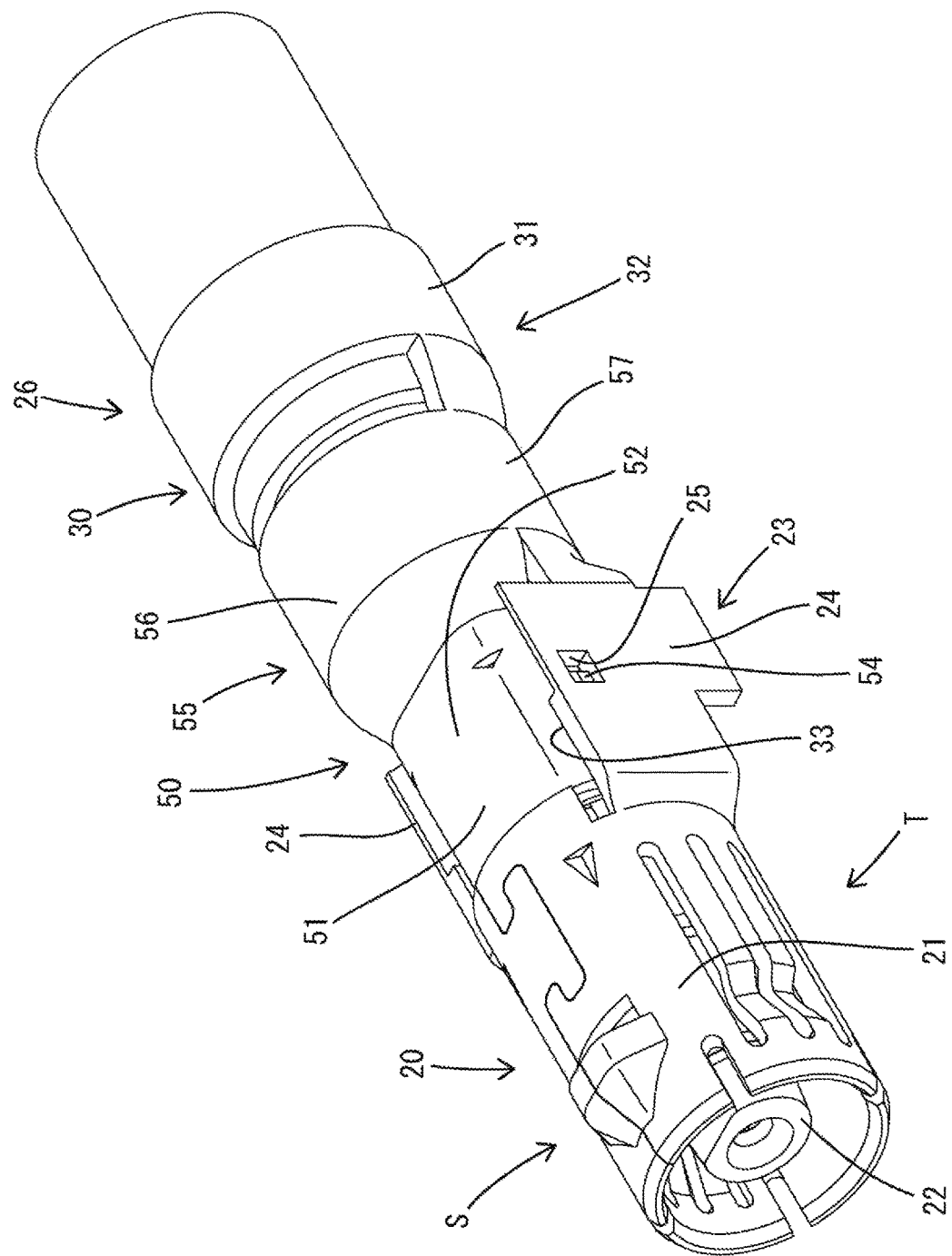
FIG. 1 is a perspective view of a shield conductive path of an embodiment.
Figure 2:
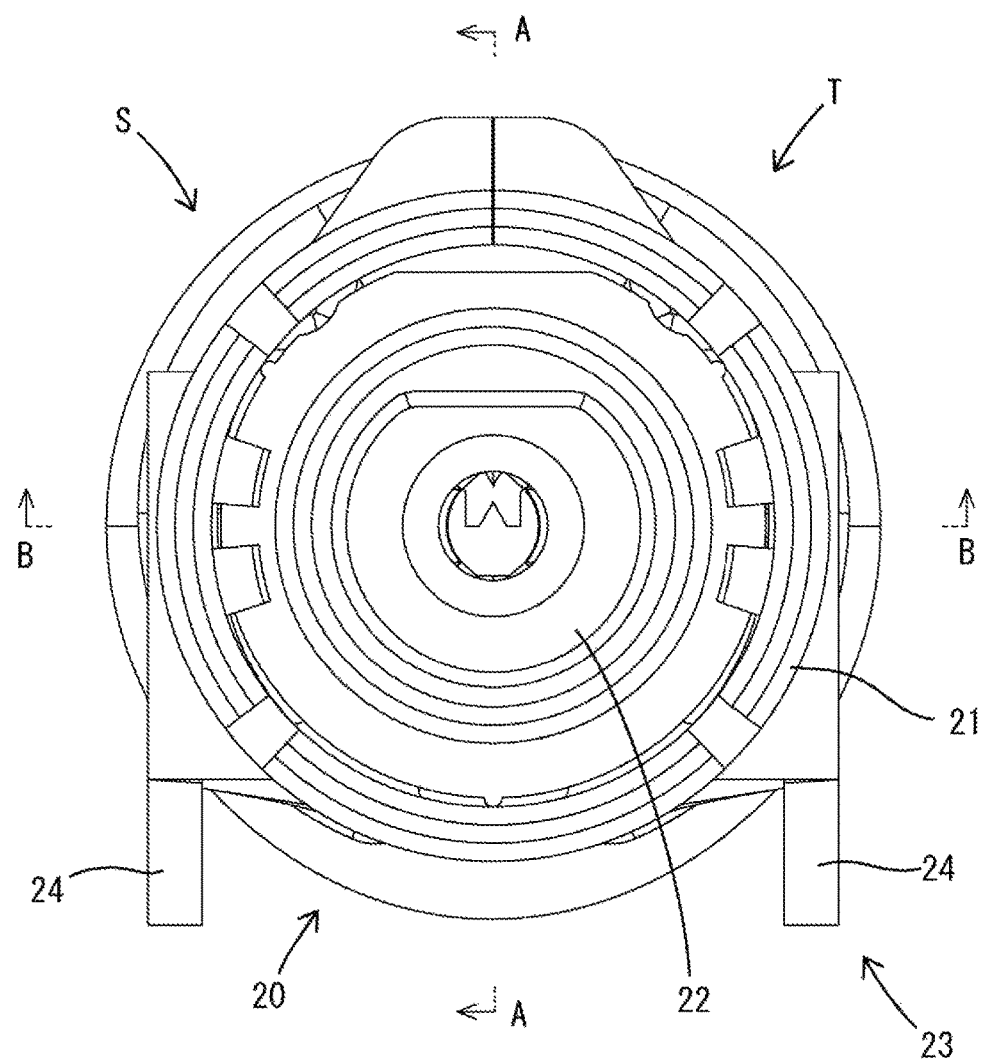
FIG. 2 is a front view of the shield conductive path.
Figure 3:
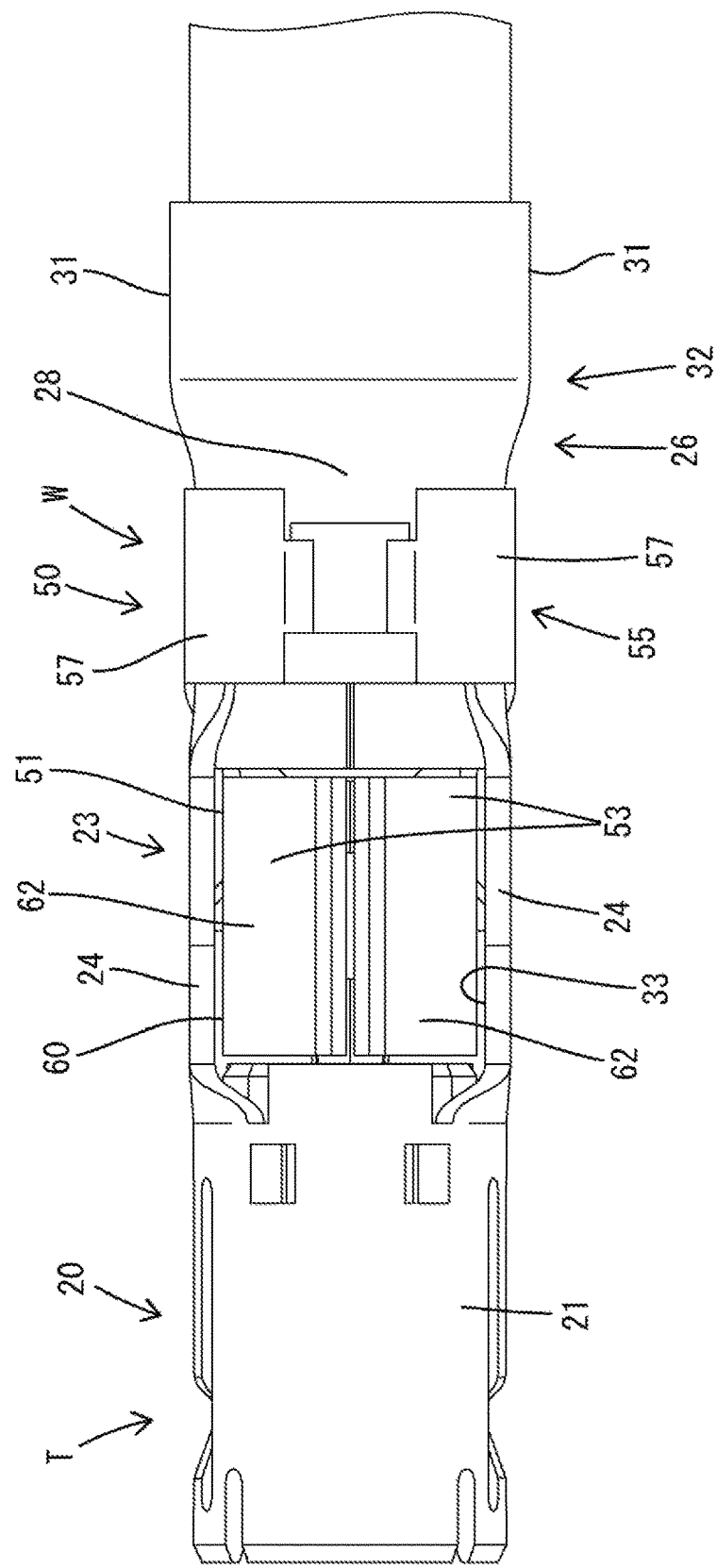
FIG. 3 is a bottom view of the shield conductive path.
Figure 4:
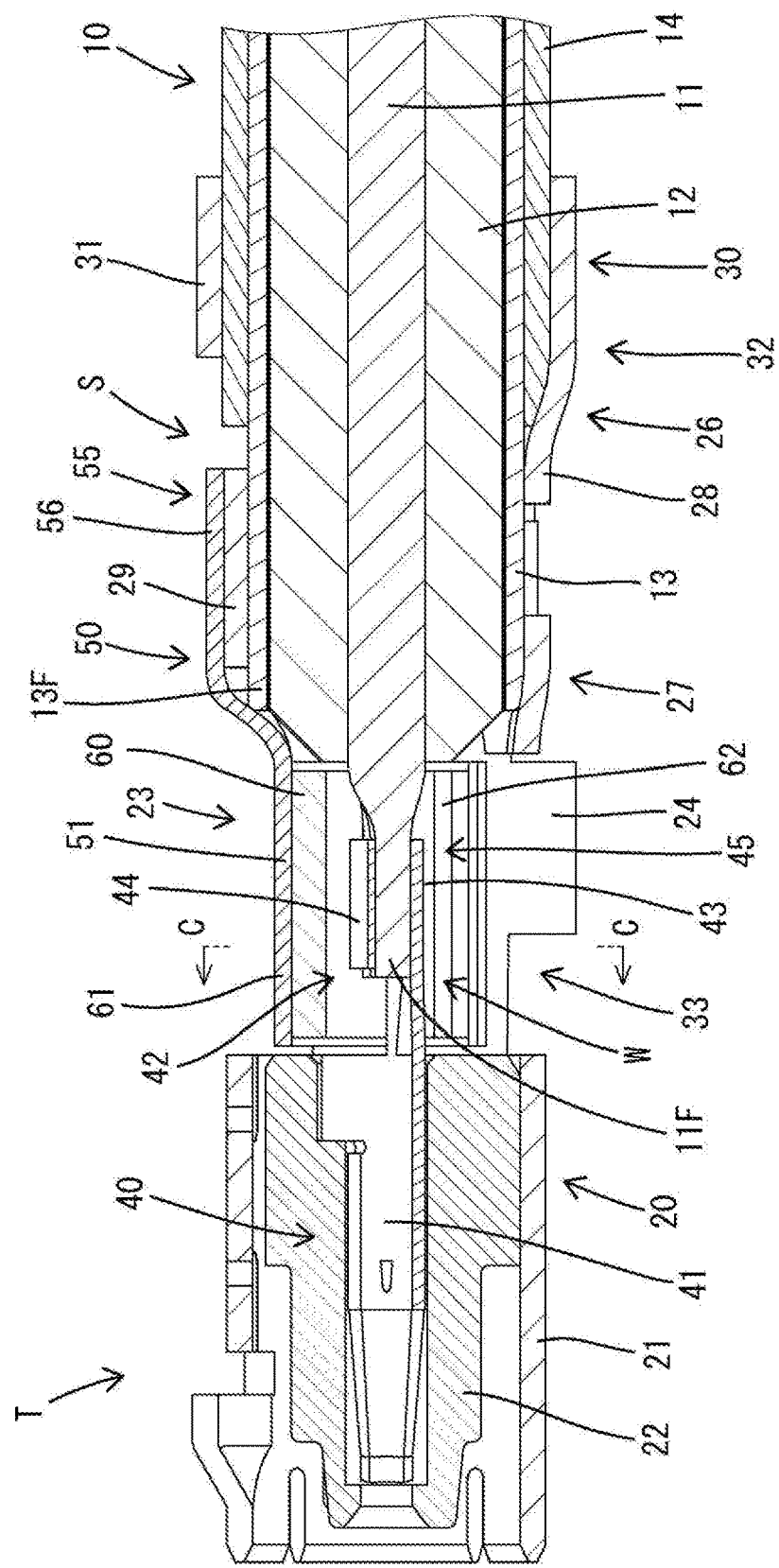
FIG. 4 is a section along A-A of FIG. 2.

One specific embodiment of the present invention is described with reference to FIGS. 1 to 11. Note that, in the following description, a left side in FIGS. 3 to 5, 8 and 9 is defined as a front side concerning a front-rear direction. Upper and lower sides shown in FIGS. 1, 2, 4, 6, 7 and 9 to 11 are directly defined as upper and lower sides concerning a vertical direction.

A shield conductive path of this embodiment is configured to functionally include an inner conductor conductive path W and an outer conductor conductive path S, and the outer conductor conductive path S has a function of electrically shielding the inner conductor conductive path W used as a signal line or the like. The inner conductor conductive path W is composed of a core 11 and an inner conductor terminal 40 to be described later. The outer conductor conductive path S is composed of a braided wire 13 (shield layer as claimed), an outer conductor shell 20 and a shield cover 50. Further, the shield conductive path is configured by connecting a shield terminal T and a shielded wire 10 as constituent components. The shield terminal T includes the outer conductor shell 20, a shell-side dielectric 22, the inner conductor terminal 40, the shield cover 50 and a cover-side dielectric 60.

The shielded wire 10 is a conductive path having a multi-layer structure with one core 11 made of an electrically conductive material, a tubular insulator 12 made of synthetic resin and surrounding the core 11, the tubular braided wire 13 formed by braiding thin material wires into a net and disposed on the outer periphery of the insulator 12 and a sheath 14 made of synthetic resin and surrounding the braided wire 13. In a front end part of the shielded wire 10, the sheath 14 is removed to expose a front end part 13F of the braided wire 13 and a front end part 11F of the core 11 is cantilevered forward while being exposed from the front end surface of the insulator 12.

The insulator 12, which functions as a dielectric, is interposed over the entire circumference between the braided wire 13 and the core 11. By the presence of this insulator 12, the inner periphery of the braided wire 13 and the outer periphery of the core 11 are in such a positional relationship as to be at a predetermined distance from each other in a radial direction. By this positional relationship, an impedance in the front end part 11F of the core 11 is set at a value to make transmission performance in a high-frequency band satisfactory.

The outer conductor shell 20 is a single component formed by applying bending and the like to a metal plate material. A hollow cylindrical shell body portion 21 is formed in a front end side region of the outer conductor shell 20. The substantially concentric hollow cylindrical shell-side dielectric 22 is accommodated in a fixed state in the shell body portion 21.

The outer conductor shell 20 is formed with a coupling portion 23 extending rearward from the rear end of the shell body portion 21. The coupling portion 23 is composed of a pair of left and right side wall portions 24. The pair of side wall portions 24 extend rearward from side walls constituting the shell body portion 21. Each of the pair of side wall portions 24 is formed with a locking hole 25 (displacement restricting portion as claimed). The inside of the coupling portion 23 serves as an accommodation space 33 for accommodating an inner conductor connecting portion 45 to be described later. The accommodation space 33 is open in directions (upward and downward directions) intersecting an axis of the shield conductive path. The front end surface of the insulator 12 and the rear end surface of the shell-side dielectric 22 are facing the accommodation space 33.

A shell-side fixing portion 26 in the form of an open barrel is formed in a rear end side region of the outer conductor shell 20. The shell-side fixing portion 26 is composed of a wire barrel portion 27 and an insulation barrel portion 30 connected to and behind the wire barrel portion 27. The wire barrel portion 27 is a crimping portion of a known form composed of a front end side region of a bottom wall portion 28 long in the front-rear direction and a pair of left and right first crimping pieces 29 extending upward from both left and right side edges of the bottom wall portion 28.

The front ends of the pair of first crimping pieces 29 are connected to the rear ends of the pair of side wall portions 24. Thus, the shell body portion 21 and the shell-side fixing portion 26 are coupled via the pair of side wall portions 24. The insulation barrel portion 30 is a crimping portion of a known form composed of a rear end side region of the bottom wall portion 28 and a pair of left and right second crimping pieces 31 extending upward from both left and right side edges of the bottom wall portion 28.

The shell-side fixing portion 26 is fixed to a front end part of the shielded wire 10 by crimping. Specifically, the wire barrel portion 27 is electrically conductively fixed to the front end part 13F of the braided wire 13 to surround the front end part 13F. A connecting part of this wire barrel portion 27 and the front end part 13F of the braided wire 13 constitutes an outer conductor connecting portion 32. Further, the insulation barrel portion 30 is fixed to a front end part of the sheath 14 to surround this front end part.

The insulator 12, which functions as a dielectric, is interposed over the entire circumference between the outer conductor connecting portion 32 and the core 11. By the presence of this insulator 12, the inner periphery of the outer conductor connecting portion 32 and the outer periphery of the core 11 are in such a positional relationship as to be at a predetermined distance from each other in the radial direction. By this positional relationship, an impedance in the outer conductor connecting portion 32 and the front end part 11F of the core 11 is set at a value to make transmission performance in a high-frequency band satisfactory.

The inner conductor terminal 40 is a single component formed by applying bending and the like to a metal plate material. A hollow cylindrical terminal body portion 41 is formed in a front end side region of the inner conductor terminal 40. The terminal body portion 41 is accommodated into the shell-side dielectric 22 and held in a state where relative displacements in an axial direction, the vertical direction and the lateral direction with respect to the shell-side dielectric 22 and the shell body portion 21 are restricted.

The shell-side dielectric 22 is interposed over the entire circumference between the terminal body portion 41 and the shell body portion 21. By the presence of this shell-side dielectric 22, the outer periphery of the terminal body portion 41 and the inner periphery of the shell body portion 21 are in such a positional relationship as to be at a predetermined distance from each other in the radial direction. By this positional relationship, an impedance in the shell body portion 21 and the terminal body portion 41 is set at a value to make transmission performance in a high-frequency band satisfactory.

A terminal-side fixing portion 42 in the form of an open barrel is formed in a rear end side region of the inner conductor terminal 40. The terminal-side fixing portion 42 is composed of a bottom plate portion 43 extending rearward from the rear end of a bottom surface portion constituting the terminal body portion 41 and a pair of left and right crimping pieces 44 extending upward from both left and right side edges of the bottom plate portion 43.

With the terminal body portion 41 mounted in the shell-side dielectric 22, the terminal-side fixing portion 42 is disposed at a position corresponding to the coupling portion 23 in the axial direction (i.e. between the rear end of the shell body portion 21 and the front end of the shell-side fixing portion 26). The terminal-side fixing portion 42 is accommodated in the accommodation space 33 open upward and downward with clearances defined to the pair of side wall portions 24. In the vertical direction, the terminal-side fixing portion 42 is disposed substantially at a center position of the accommodation space 33.

In the accommodation space 33, the terminal-side fixing portion 42 is electrically conductively fixed to the front end part 11F of the core 11 by crimping to surround this front end part 11F. A connecting part of this terminal-side fixing portion 42 and the front end part 11F of the core 11 constitutes the inner conductor connecting portion 45. The inner conductor connecting portion 45 is located in front of the outer conductor connecting portion 32 and behind the shell body portion 21 and the terminal body portion 41.

The shield cover 50 is a single component formed by applying bending and the like to a metal plate material. A cover body portion 51 is formed in a front end side region of the shield cover 50. The cover body portion 51 includes a base plate portion 52 and a pair of left and right flexible cover portions 53 extending downward from both left and right side edges of the base plate portion 52. The cover body portion 51 surrounds the inner conductor connecting portion 45 in a non-contact manner. In the axial direction, the cover body portion 51 is disposed in front of the outer conductor connecting portion 32 and behind the shell body portion 21 and the terminal body portion 41.

The base plate portion 52 of the cover body portion 51 is disposed above the inner conductor connecting portion 45. The pair of flexible cover portions 53 are accommodated inside the accommodation space 33 and disposed to sandwich the inner conductor connecting portion 45 from left and right sides in a non-contact manner. Lower end parts of the pair of flexible cover portions 53 are bent at a position lower than the inner conductor connecting portion 45 to be routed below the inner conductor connecting portion 45. The lower end parts (extending end parts) of the pair of flexible cover portions 53 are proximately facing each other or are in contact with each other to butt against each other. Thus, the cover body portion 51 surrounds the inner conductor connecting portion 45 substantially over the entire circumference.

Figure 5:
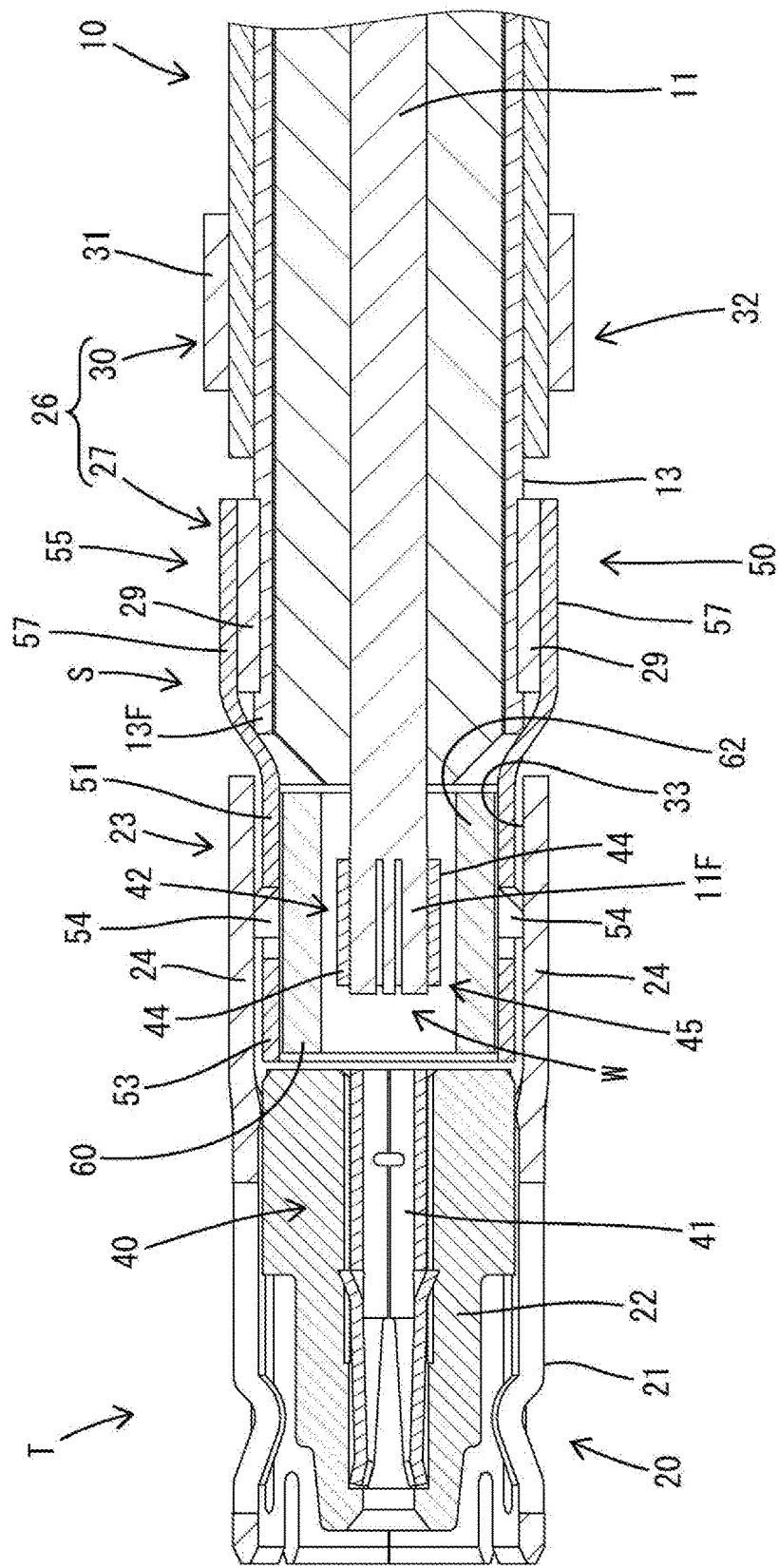
FIG. 5 is a section along B-B of FIG. 2.
Figure 6:
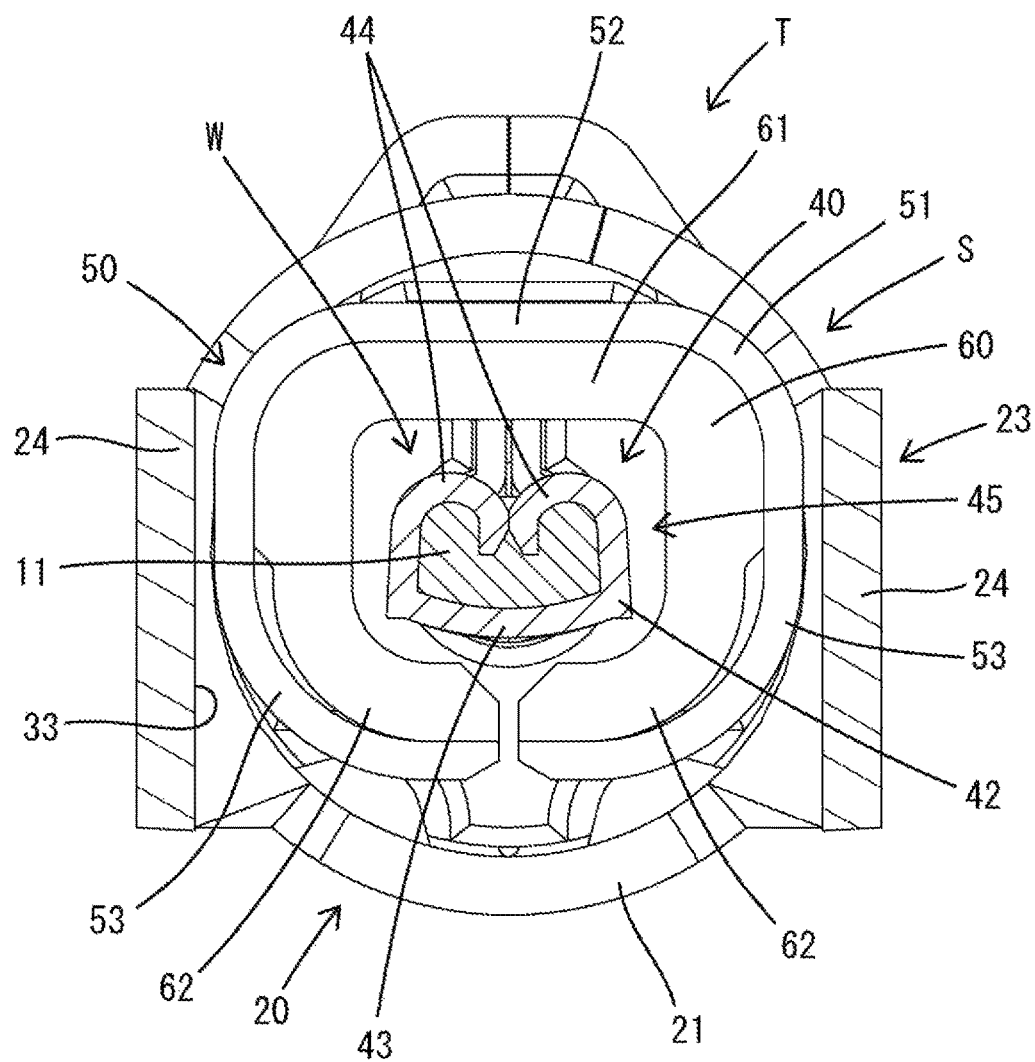
FIG. 6 is a section along C-C of FIG. 4.
Figure 7:
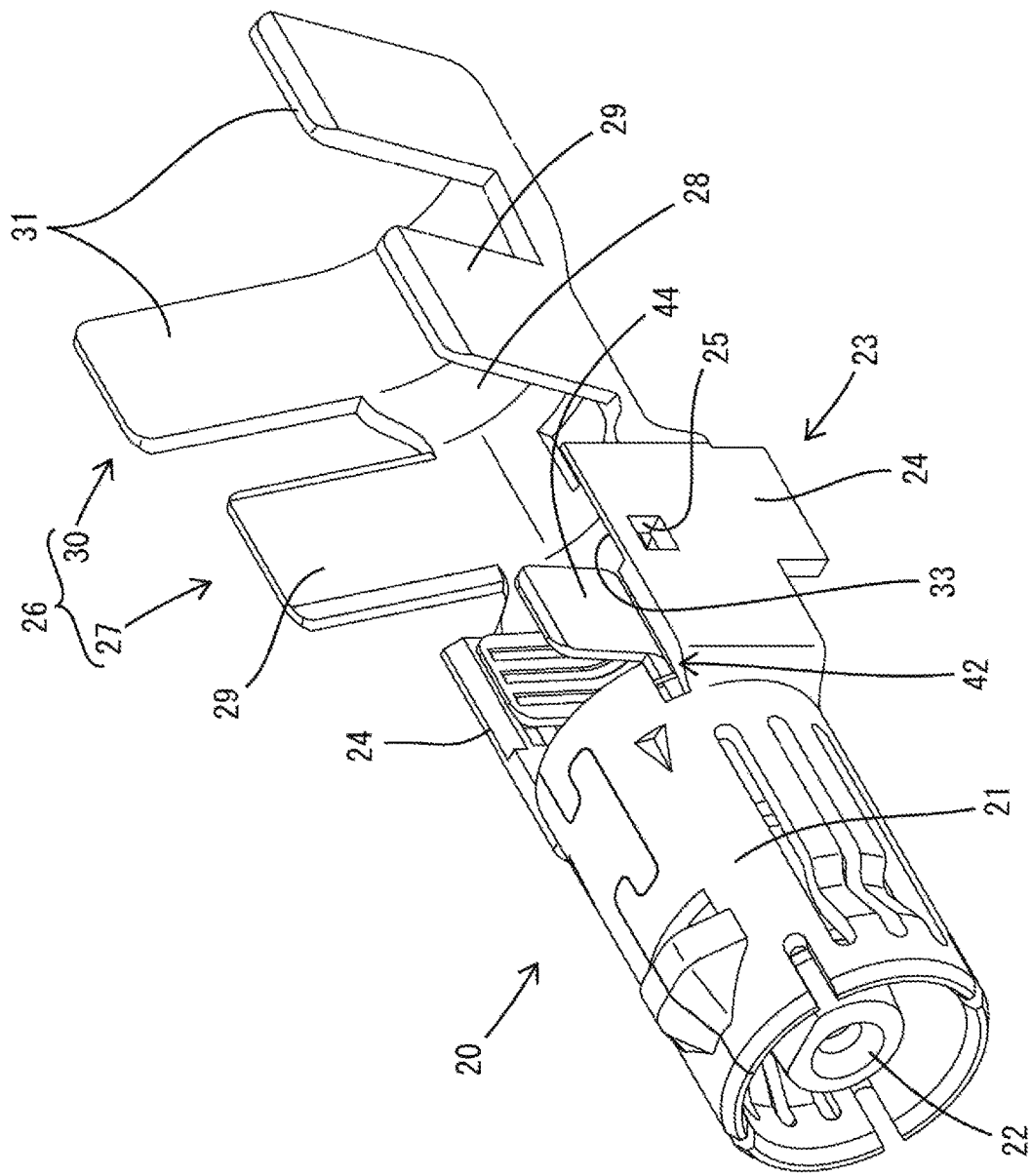
FIG. 7 is a perspective view showing a state where an outer conductor shell and an inner conductor terminal are assembled.
Figure 8:
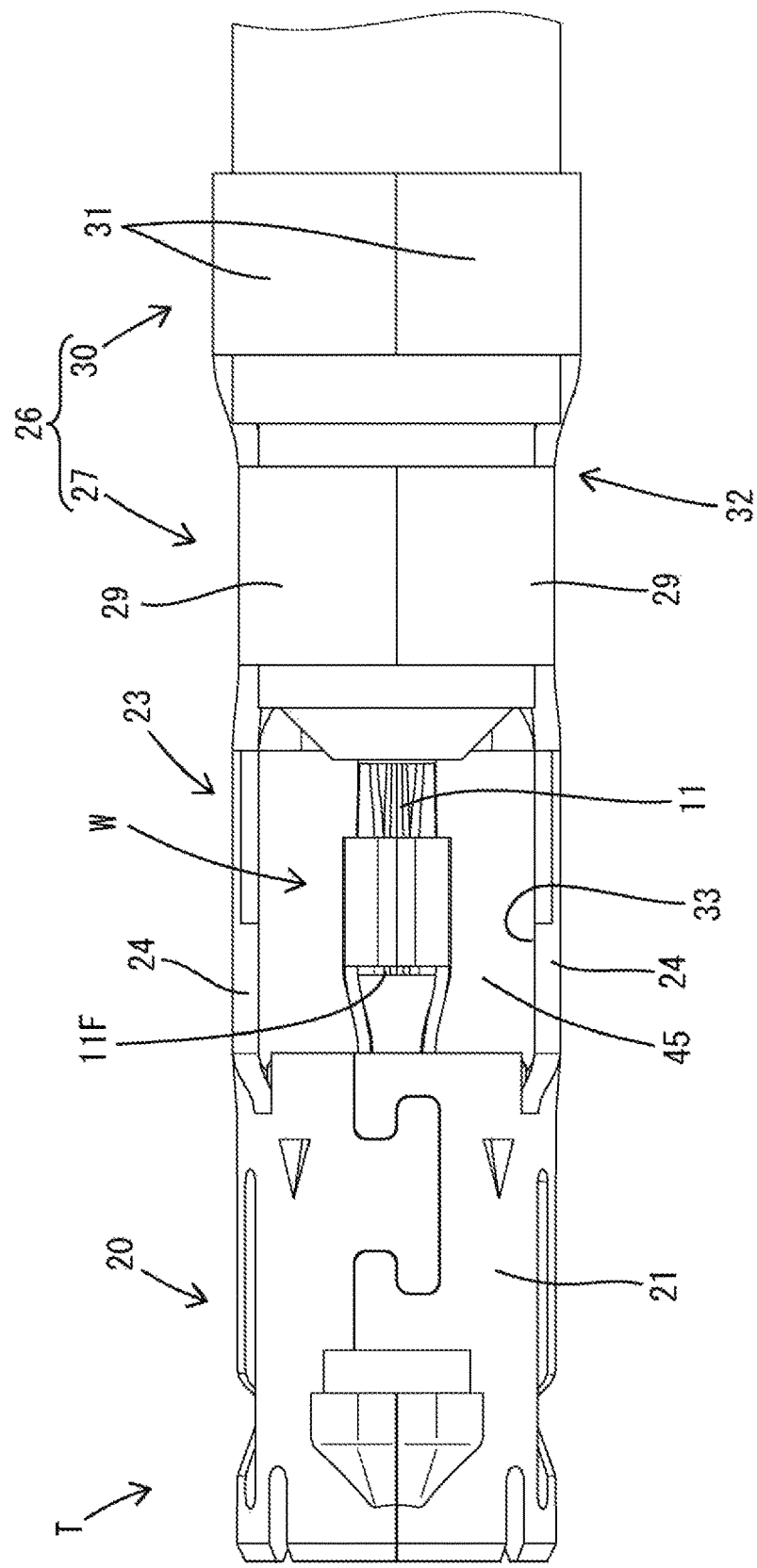
FIG. 8 is a plan view showing a state where a shielded wire is connected to the outer conductor shell and the inner conductor terminal.
Figure 9:
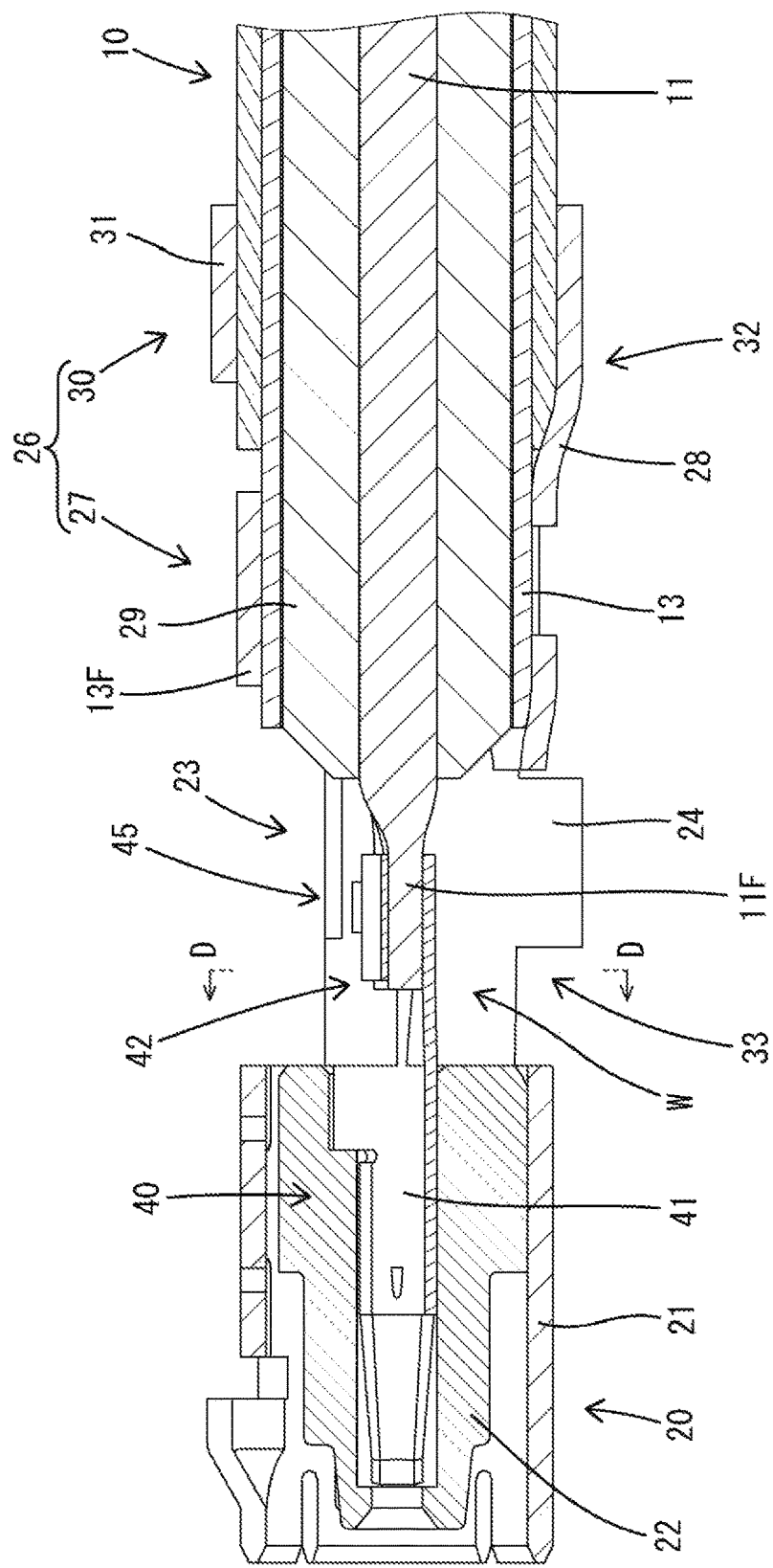
FIG. 9 is a section, corresponding to the section along A-A, showing the state where the shielded wire is connected to the outer conductor shell and the inner conductor terminal.
Figure 10:
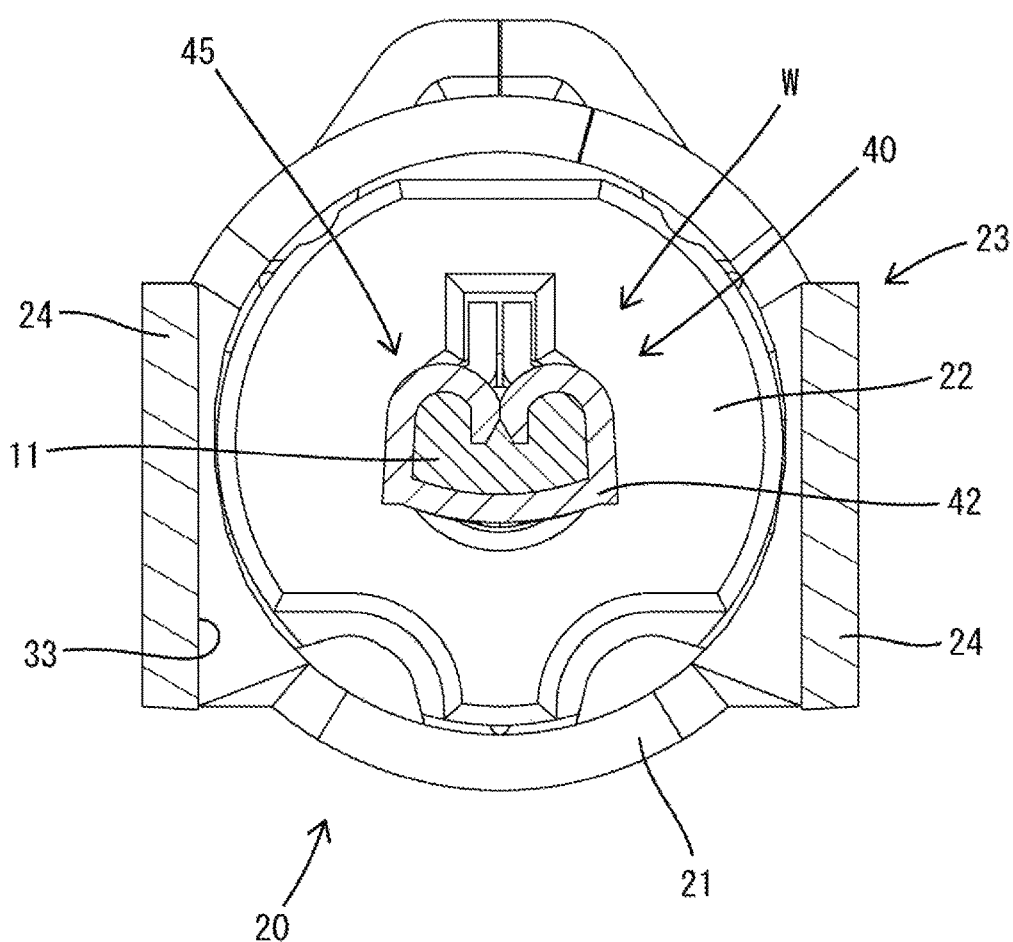
FIG. 10 is a section along D-D of FIG. 9.
Figure 11:
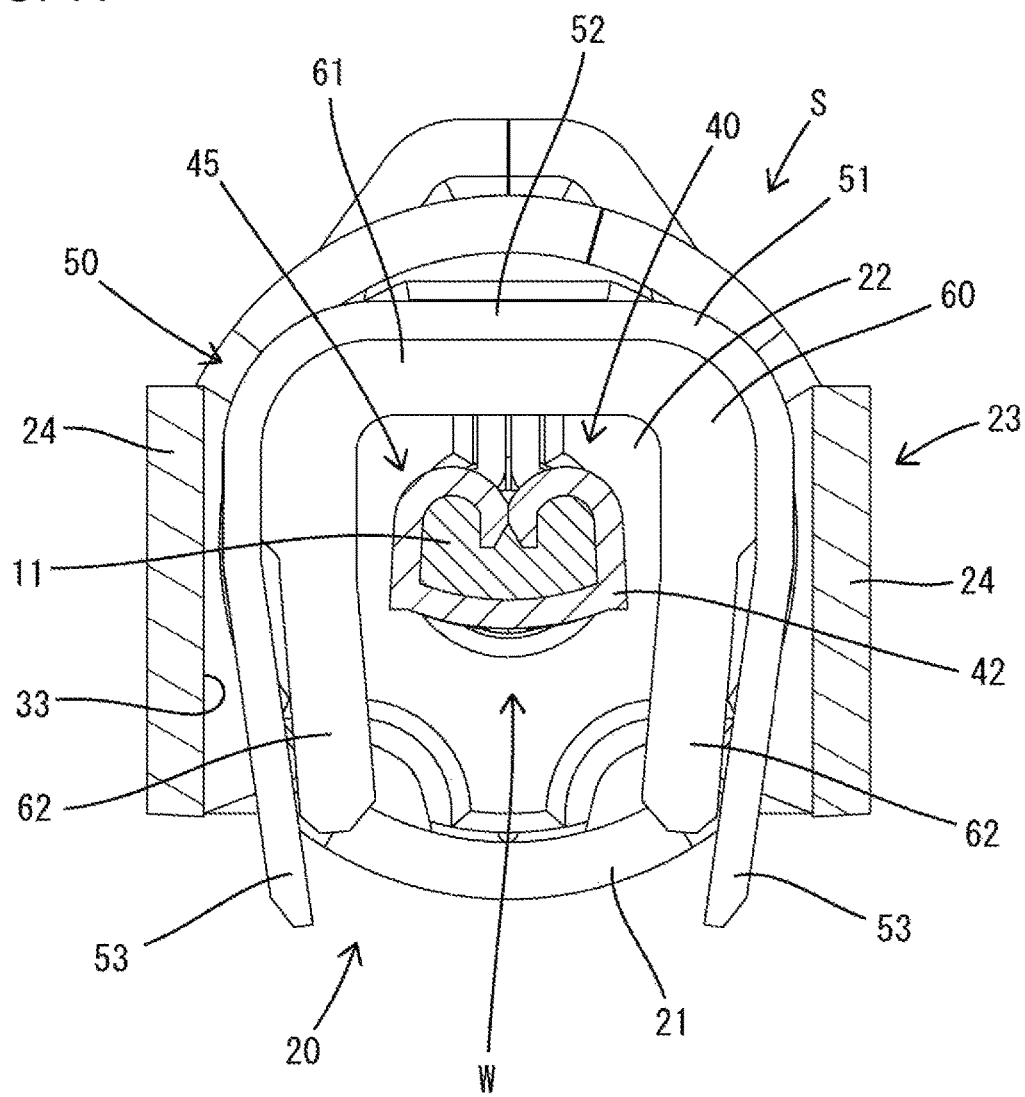
FIG. 11 is a section, corresponding to the section along C-C, showing a state where a shield cover is mounted on the outer conductor shell and flexible cover portions and flexible covering portions are not deformed.

A locking projection 54 (displacement restricting portion as claimed) projecting outward is formed in an upper end region of the flexible cover portion 53 (see FIGS. 1 and 5). The locking projections 54 are locked into locking holes 25 of the side wall portions 24, whereby the cover body portion 51 is held in a state where relative displacements in the front-rear direction, vertical direction and lateral direction are restricted with respect to the coupling portion 23 and the inner conductor connecting portion 45. Further, the cover body portion 51 (shield cover 50) and the coupling portion 23 (outer conductor shell 20) are electrically conductively connected via the locking projections 54 and the locking holes 25.

A cover-side fixing portion 55 in the form of an open barrel is formed in a rear end side region of the shield cover 50. The cover-side fixing portion 55 is composed of an upper plate portion 56 extending rearward from the rear end of the base plate portion 52 of the cover body portion 51 and a pair of left and right side plate portions 57 extending downward from both left and right side edges of the upper plate portion 56. The cover-side fixing portion 55 is electrically conductively fixed to the front end part 13F of the braided wire 13 and the wire barrel portion 27 of the shell-side fixing portion 26 by crimping to surround these.

As just described, the shield cover 50 is fixed with relative displacements restricted with respect to the shielded wire 10 and the outer conductor shell 20 by crimping the shell-side fixing portion 26 to the outer peripheries of the insulator 12 and the braided wire 13. Further, since the first crimping pieces 29 of the wire barrel portion 27 are cantilevered upward, upper end parts (extending end parts) of the first crimping pieces 29 may be deformed away from each other and separated from the braided wire 13. However, since the upper plate portion 56 of the cover-side fixing portion 55 presses the outer peripheries of the upper end parts of the first crimping pieces 29, contact reliability between the upper end parts of the first crimping pieces 29 and the braided wire 13 is enhanced.

The cover-side dielectric 60 is a single component made of synthetic resin and composed of a plate-like base portion 61 and a pair of flexible covering portions 62 cantilevered downward from both left and right side edges of the base portion 61. The base portion 61 is disposed to extend along the inner surface (lower surface) of the base plate portion 52 of the cover body portion 51 and be located above the inner conductor connecting portion 45. The pair of flexible covering portions 62 are disposed to extend along the inner surfaces of the flexible cover portions 53 of the cover body portion 51 and sandwich the inner conductor connecting portion 45 from left and right sides.

Lower end parts of the pair of flexible covering portions 62 are bent at a position lower than the inner conductor connecting portion 45 to be routed below the inner conductor connecting portion 45. The lower end parts (extending end parts) of the pair of flexible covering portions 62 are proximately facing each other or are in contact with each other to butt against each other. Thus, the cover-side dielectric 60 surrounds the inner conductor connecting portion 45 substantially over the entire circumference, similarly to the cover body portion 51. Further, the inner peripheral surface of the cover-side dielectric 60 and the outer periphery of the inner conductor connecting portion 45 are facing each other in a non-contact manner while being spaced apart by a predetermined distance over the entire circumference.

As just described, the cover-side dielectric 60 is interposed over the entire circumference between the inner conductor connecting portion 45 and the cover body portion 51 (shield cover 50) and, by the presence of the cover-side dielectric 60, the outer periphery of the inner conductor connecting portion 45 and the inner periphery of the cover body portion 51 is in such a positional relationship as to be at a predetermined distance from each other in the radial direction. Further, air is interposed over the entire circumference between the inner conductor connecting portion 45 and the cover body portion 51. By ensuring the distance in the radial direction by this cover-side dielectric 60 and by the presence of air, an impedance in a region where the inner conductor connecting portion 45 and the cover body portion 51 correspond is set at a value to make transmission performance in a high-frequency band satisfactory, similarly to the impedance in the region where the outer conductor connecting portion 32 and the core 11 correspond and the impedance in the region where the shell body portion 21 and the terminal body portion 41 correspond.

Next, an assembling process of the shield conductive path of this embodiment is described. First, the shell-side dielectric and the terminal body portion 41 are accommodated into the shell body portion 21. Subsequently, the shell-side fixing portion 26 is crimped to the front end part 13F of the braided wire 13 of the shielded wire 10 to constitute the outer conductor connecting portion 32, and the terminal-side fixing portion 42 is crimped to the front end part 11F of the core 11 to constitute the inner conductor connecting portion 45 (see FIGS. 8 to 10). Here, a crimping step of the terminal-side fixing portion 42 may be performed simultaneously with a crimping step of the shell-side fixing portion 26 or may be performed after the crimping step of the shell-side fixing portion 26.

After the outer conductor shell 20 and the inner conductor terminal 40 are fixed to the shielded wire 10, the shield cover 50 is mounted on the outer conductor shell 20 and the shielded wire 10 from above. At this time, the lower end parts of the flexible cover portions 53 and those of the flexible covering portions 62 are spread apart so as not to interfere with the inner conductor connecting portion 45. Then, the cover body portion 51 and the cover-side dielectric 60 are accommodated into the accommodation space 33 and the locking projections 54 are locked into the locking holes 25. By locking between the locking projections 54 an the locking holes 25, the shield cover 50 is temporarily held in a state positioned with respect to the outer conductor shell 20.

Thereafter, the cover-side fixing portion 55 is crimped to the shielded wire 10 and the shell-side fixing portion 26, and the lower end parts of the flexible cover portions 53 and those of the flexible covering portions 62 are pressed to be bent and deformed inwardly. The flexible cover portions 53 and the flexible covering portions 62 may be worked simultaneously with a crimping step of the cover-side fixing portion 55 or may be performed after the crimping step of the cover-side fixing portion 55. In the above way, the assembling of the shield conductive path is completed.

As described above, the shield conductive path of this embodiment includes the shielded wire 10, the outer conductor shell 20, the inner conductor terminal 40 and the shield cover 50. The shielded wire 10 is formed such that the core 11 is surrounded by the tubular braided wire 13. The tubular shell body portion 21 is formed in the front end part of the outer conductor shell 20, and the shell-side fixing portion 26 formed in the rear end part of the outer conductor shell 20 is electrically conductively fixed to the front end part 13F of the braided wire 13. The outer conductor shell 20 is formed with the coupling portion 23 configured to electrically conductively couple the shell body portion 21 and the shell-side fixing portion 26.

The terminal body portion 41 formed in the front end part of the inner conductor terminal 40 is accommodated in the shell body portion 21, and the terminal-side fixing portion 42 formed in the rear end part of the inner conductor terminal 40 is electrically conductively fixed to the front end part 11F of the core 11 in the coupling portion 23. The shield cover 50 is formed with the cover-side fixing portion 55 electrically conductively fixed to at least one of the outer conductor shell 20 and a shield layer. Likewise, the shield cover 50 is formed with the cover body portion 51 configured to surround the inner conductor connecting portion 45 composed of the front end part 11F of the core 11 and the terminal-side fixing portion 42 in a non-contact manner.

In the shield conductive path of this embodiment, the terminal body portion 41 is surrounded by the shell body portion 21 of the outer conductor shell 20, whereas the inner conductor connecting portion 45 is surrounded by the cover body portion 51 of the shield cover 50, which is a component separate from the outer conductor shell 20. According to this configuration, even if the terminal body portion 41 and the inner conductor connecting portion 45 differ in size in a cross-section intersecting the axial direction of the shield conductive path, the impedance in the region where the inner conductor connecting portion 45 and the cover body portion 51 correspond can be matched with the impedance in the region where the terminal body portion 41 and the shell body portion 21 correspond and the impedance in the region where the braided wire 13 and the shell-side fixing portion 26 correspond. This can improve transmission performance in the connecting part of the inner conductor terminal 40 and the core 11 of the shielded wire 10.

Further, the cover body portion 51 of the shield cover 50 includes the flexible cover portions 53 displaceable radially inwardly to approach the inner conductor connecting portion 45. According to this configuration, one type of the shield cover 50 can be used as a common component for a plurality of types of the inner conductor terminals 40 differing in the size of the inner conductor connecting portion 45.

Further, the cover-side dielectric 60 configured to surround the inner conductor connecting portion 45 is mounted on the inner periphery of the cover body portion 51. According to this configuration, workability is good since the shield cover 50 and the cover-side dielectric 60 can be integrally handled in mounting the shield cover 50 and the cover-side dielectric 60 on the outer conductor shell 20 and the shielded wire 10.

Further, focusing on that the cover body portion 51 includes the radially displaceable flexible cover portions 53, the flexible covering portions 62 of the cover-side dielectric 60 are configured to be radially displaceable integrally with the flexible cover portions 53. According to this configuration, one type of the cover-side dielectric 60 can be used as a common component for a plurality of types of the inner conductor terminals 40 differing in the size of the inner conductor connecting portion 45.

Further, the cover body portion 51 is formed with the locking projections 54, the coupling portion 23 is formed with the locking holes 25, and relative displacements of the cover body portion 51 with respect to the coupling portion 23 are restricted by locking the locking projections 54 and the locking holes 25. According to this configuration, the shield cover 50 is stably fixed to the outer conductor shell 20 at two front and rear positions, i.e. a locking position where the locking projections 54 and the locking holes 25 are locked and a fixed position by the cover-side fixing portion 55.

Further, the coupling 23 is composed of the two side walls 24 disposed to sandwich the inner conductor connecting portion 45 in a width direction intersecting the axis. According to this configuration, a step of fixing the terminal-side fixing portion 42 and the core 11 can be performed after or at the same time as the outer conductor shell 20 is assembled with the shielded wire 10.

The invention is not limited to the above described and illustrated embodiment. For example, the following embodiments also are included in the scope of the invention.

Although the cover body includes the flexible covers displaceable in the radial direction in the above embodiment, the entire cover body may be formed to have a high rigidity so as to be difficult to radially displace.

Although the cover-side dielectric is mounted on the inner periphery of the cover body in the above embodiment, the cover-side dielectric may be mounted on the inner conductor connecting portion or the outer conductor shell separately from the shield cover.

Although the cover-side dielectric includes the flexible coverings radially displaceable integrally with the flexible covers in the above embodiment, the entire cover-side dielectric may be formed to have a high rigidity so as to be difficult to displace radially.

Although the coupling portion is composed of the two side walls in the above embodiment, the coupling may be composed of a U-shaped plate material.

Although the cover body is locked to the coupling in the above embodiment, the cover body may not be in contact with the coupling. In this case, the cover body may be locked to the shell body.

LIST OF REFERENCE SIGNS

10 . . . shielded wire
11 . . . core
13 . . . braided wire (shield layer)
20 . . . outer conductor shell
21 . . . shell body
23 . . . coupling
24 . . . side wall
25 . . . locking hole (displacement restricting portion)
26 . . . shell-side fixing portion
40 . . . inner conductor terminal
41 . . . terminal body
42 . . . terminal-side fixing portion
45 . . . inner conductor connecting portion
50 . . . shield cover
51 . . . cover body
53 . . . flexible cover
54 . . . locking projection (displacement restricting portion)
55 . . . cover-side fixing portion
60 . . . cover-side dielectric
62 . . . flexible covering

What is claimed is:

1. A shield conductive path, comprising:
   a shielded wire having a core surrounded by a tubular shield layer;
   an inner conductor terminal having a terminal-side fixing portion electrically conductively fixed to a front part of the core to define an inner conductor connecting portion and having a terminal body forward of the inner conductor connecting portion;
   a shell-side dielectric surrounding the terminal body;
   a cover-side dielectric surrounding the inner conductor connecting portion;
   an outer conductor shell including a tubular shell body formed at a front end part and surrounding the shell side dielectric, a shell-side fixing portion in a rear end part and being electrically conductively fixed to a front end part of the shield layer of the shielded wire, and a coupling that electrically conductively couples the shell body and the shell-side fixing portion; and
   a shield cover including a cover-side fixing portion electrically conductively fixed in surrounding relationship to at least one of the outer conductor shell and the shield layer and a cover body engaged with the cover-side dielectric and surrounding the inner conductor connecting portion in a non-contact manner.

2. The shield conductive path of claim 1, wherein the cover body includes a flexible cover displaceable in a radial direction.

3. The shield conductive path of claim 2, wherein:
   the cover-side dielectric includes a flexible covering configured to displace in the radial direction integrally with the flexible cover.

4. The shield conductive path of claim 1, wherein the cover body and the coupling are formed with displacement restricting portions configured to restrict a relative displacement of the cover body with respect to the coupling by being locked to each other.

5. The shield conductive path of claim 1, wherein the coupling is composed of two side walls disposed to sandwich the inner conductive connecting portion in a width direction intersecting an axis.

* * * * *